(12) United States Patent
Mochizuki et al.

(10) Patent No.: US 9,231,811 B2
(45) Date of Patent: Jan. 5, 2016

(54) RECEIVER DEVICE, TRANSMIT/RECEIVE TERMINAL, PROPAGATION DELAY TIME MEASUREMENT METHOD AND COMPUTER PROGRAM

(71) Applicant: NEC Corporation, Tokyo (JP)

(72) Inventors: Takashi Mochizuki, Tokyo (JP); Masahiro Tsuboshima, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/416,906

(22) PCT Filed: Apr. 24, 2013

(86) PCT No.: PCT/JP2013/062124
§ 371 (c)(1),
(2) Date: Jan. 23, 2015

(87) PCT Pub. No.: WO2014/017137
PCT Pub. Date: Jan. 30, 2014

(65) Prior Publication Data
US 2015/0215149 A1    Jul. 30, 2015

(30) Foreign Application Priority Data

Jul. 27, 2012    (JP) ................................. 2012-166904

(51) Int. Cl.
*H04L 27/26*    (2006.01)
*H04L 25/02*    (2006.01)
(Continued)

(52) U.S. Cl.
CPC ............ *H04L 27/2695* (2013.01); *G01R 23/16* (2013.01); *H04J 11/0036* (2013.01);
(Continued)

(58) Field of Classification Search
CPC .............. H04L 27/2695; H04L 25/022; H04L 25/0232; H04L 25/0222; H04L 27/2614; H04L 27/2647; G01R 23/16; H04J 11/0036; H04J 2011/0096; H04W 56/0065; H04W 56/001
See application file for complete search history.

(56) References Cited

U.S. PATENT DOCUMENTS 8,654,893 B2    2/2014  Dateki
9,065,717 B2 *  6/2015  Umeda ............... H04L 27/2657
(Continued)

FOREIGN PATENT DOCUMENTS

JP    2000-134176    5/2000
JP    2008-167088    7/2008
(Continued)

OTHER PUBLICATIONS

International Search Report, PCT/JP2013/062124, May 21, 2013.
(Continued)

*Primary Examiner* — Dac Ha
(74) *Attorney, Agent, or Firm* — Young & Thompson

(57) ABSTRACT

A receiver device is provided with: channel estimation unit which obtains channel estimation values for a frequency domain on the basis of pilot symbols disposed in an OFDM subcarrier; interpolation unit which performs interpolation so that the number of samples of channel estimation values obtained by the channel estimation unit is a power of 2; transformation unit which transforms the channel estimation values interpolated by the interpolation unit into a time domain to obtain a delay profile; and power peak position detection unit which detects a power peak position of the delay profile so as to obtain a propagation delay time. The power peak position detection unit references the signal power of the portion interpolated by the interpolation unit in order to detect a suitable power peak position in the delay profile.

6 Claims, 14 Drawing Sheets

(51) Int. Cl.
*G01R 23/16* (2006.01)
*H04J 11/00* (2006.01)
*H04W 56/00* (2009.01)

(52) U.S. Cl.
CPC .......... *H04L25/022* (2013.01); *H04L 25/0222* (2013.01); *H04L 25/0232* (2013.01); *H04L 27/2614* (2013.01); *H04W 56/0065* (2013.01); *H04J 2011/0096* (2013.01); *H04L 27/2647* (2013.01); *H04W 56/001* (2013.01)

(56) References Cited

U.S. PATENT DOCUMENTS

| | | |
|---|---|---|
| 2008/0267320 A1 | 10/2008 | Dateki |
| 2009/0046787 A1* | 2/2009 | Uesugi ................ H04L 5/0007 375/260 |
| 2009/0310479 A1* | 12/2009 | Kisoda ................ H04L 25/0232 370/210 |

FOREIGN PATENT DOCUMENTS

| | | |
|---|---|---|
| JP | 2009-049792 | 3/2009 |
| JP | 2010-183277 | 8/2010 |
| JP | 2012-175283 | 9/2012 |
| WO | 2007/077608 | 7/2007 |
| WO | WO 2008/023680 | 2/2008 |

OTHER PUBLICATIONS

Dateki et al., "OFDM Channel Estimation by Adding a Virtual Channel Frequency Response", Fujitsu Laboratories, Ltd., IEEE VTC Jul. 1995, pp. 815-819.

Japanese Official Action—JP2014-526787—Oct. 27, 2015.

* cited by examiner

US 9,231,811 B2

RECEIVER DEVICE, TRANSMIT/RECEIVE TERMINAL, PROPAGATION DELAY TIME MEASUREMENT METHOD AND COMPUTER PROGRAM

CROSS REFERENCE TO RELATED APPLICATIONS

This is a U.S. national stage of application No. PCT/JP2013/062124, filed on Apr. 24, 2013. Priority under U.S.C. §119(a) and 35 U.S.C. §365(b) is claimed from Japanese Patent Applications No. 2012-166904 filed on Jul. 27, 2012, the disclosure of which is also incorporated herein by reference.

TECHNICAL FIELD

The present invention relates to a receiver device, a transmit/receive terminal, a propagation delay time measurement method, and a computer program.

BACKGROUND ART

A communication method making use of Orthogonal Frequency Division Multiplexing (OFDM), as represented by Long Term Evolution (LTE), now being discussed in 3rd Generation Partnership Project (3GPP), attracts attention as a communication method for the next generation. OFDM is a transmission method in which a bandwidth to be used is divided into multiple subcarriers, and then each data symbol is assigned to each subcarrier. Since the subcarriers are so arranged as to be orthogonal one another on a frequency axis, OFDM is excellent at frequency usage efficiency. Moreover, each subcarrier has a narrow bandwidth, and therefore an effect of multiple-path interference can be suppressed so that a high-speed large-capacity communication can be realized.

In a data transmission method using OFDM, generally at a transmission side, already-known pilot symbols besides data symbols are inserted at intervals in the frequency-wise direction and the time-wise direction, as shown in FIG. 13. At a receiver side, amplitude-phase variation of the pilot symbols is detected from a received signal, and then data symbols included in the received signal are demodulated, on the basis of the amplitude-phase variation. The amplitude-phase variation detected from the pilot symbols is called a channel estimation value.

To calculate a channel estimation value, a Cyclic Prefix (CP) part is removed from a received signal, and Fast Fourier Transform (FFT) in accordance with an effective symbol length of OFDM is carried out in order to extract pilot symbols, and then the pilot symbols extracted are verified with an already-known pattern. In this way, amplitude-phase variation of the symbols is calculated, and the amplitude-phase variation is deemed to be a channel estimation value.

A result of transforming channel estimation values of the frequency domain into the time domain by means of Inverse Fast Fourier Transform (IFFT) is called a delay profile. In a delay profile, peaks of power appear in response to propagation paths of a transmission line. A low-level part in the delay profile means that there is no propagation path, or a propagation path there is weak, so that noise power is dominant there. After replacing values of the delay profile at its low-level part with "0", transforming the data back into the frequency domain by means of FFT makes it possible to cancel noise components from the original channel estimation values. Moreover, a propagation delay time can be calculated according to the positions of power peaks in the delay profile.

The calculated propagation delay time is used for transmission time control. For example, if a mobile station for transmitting/receiving information to/from a base station by way of a wireless radio communication executes a transmitting process in accordance with timing of a received signal from the base station as it is, the transmission signal is received twice the one-way propagation time late, at the base station. In the meantime, the base station transmits/receives information to/from a plurality of mobile stations; and therefore, if a distance between the base station and each mobile station is different to others, there appears a time-wise overlap in received signals from the mobile stations so that interference occurs.

Explained below with reference to FIG. 14 and FIG. 15 is interference that occurs in the case where a mobile station executes a transmitting process in accordance with timing of a received signal from the base station as it is. For an easy understanding, an explanation is made here with a case example of transmission/receiving between one base station BS and two mobile stations MS1 and MS2.

As shown in FIG. 14, it is assumed that the mobile station MS1 receives a receiving frame "A" from the base station BS, and transmits a transmission frame "a" to the base station BS. Meanwhile, it is assumed that the mobile station MS2 receives a receiving frame "B" from the base station BS, and transmits a transmission frame "b" to the base station BS. Under the situation, if the mobile stations MS1 and MS2 transmit the transmission frame "a" and the transmission frame "b" in accordance with timing of signal receiving from the base station BS as it is, each transmission signal from the mobile stations MS1 and MS2 is received twice the one-way propagation time late, at the base station BS, as shown in FIG. 15.

Herein, a propagation delay time of the receiving frame "A" at the mobile station MS1 is defined as "$t_1$", and a propagation delay time of the receiving frame "B" at the mobile station MS2 is defined as "$t_2$". The transmission frame "a" from the mobile station MS1 is received "$2t_1$" late at the base station BS, wherein "$2t_1$" is twice a time needed for a propagation from the base station BS to the mobile station MS1. On the other hand, the transmission frame "b" from the mobile station MS2 is received "$2t_2$" late at the base station BS, wherein "$2t_2$" is twice a time needed for a propagation from the base station BS to the mobile station MS2. In this case, if the distance between the base station BS and the mobile station MS1 and the distance between the base station BS and the mobile station MS2 are different from each other, needed times for respective propagations are different ($t_1 \neq t_2$). Accordingly, at the base station BS, there appears a time-wise overlap in the transmission frame "a" from the mobile station MS1 and the transmission frame "b" from the mobile station MS2, so that interference occurs.

Explained next with reference to FIG. 16 and FIG. 17 is an adjustment of transmission timing at each of the mobile stations MS1 and MS2.

A propagation delay time measured at the mobile station MS1 is defined as "$t_1$", and a propagation delay time measured at the mobile station MS2 is defined as "$t_2$". Under this situation, the mobile station MS1 puts a transmission start timing of the transmission frame "a" in relation to the receiving frame "A" ahead twice the measured propagation delay time "$t_1$", as shown in FIG. 16. In the meantime, the mobile station MS2 puts a transmission start timing of the transmission frame "b" in relation to the receiving frame "B" ahead twice the measured propagation delay time "$t_2$", as shown in FIG. 16. According to this arrangement, each transmission frame coming from the mobile station MS1 and the mobile station MS2 is received without causing a time-wise overlap at the base station BS, accordingly having no interference, as shown in FIG. 17.

A measurement of a propagation delay time is explained below with reference to a flowchart of FIG. 18. In the following explanation, a mobile station, a transmit/receive terminal to be used as a mobile station, and a device to be used as a receiving unit of those mobile station and terminal are collectively called a "receiver device."

In order for a measurement of a propagation delay time, channel estimation values are calculated at first. For calculating a channel estimation values; CP is removed from a received signal (Step S21) as described above, FFT tailored to an effective symbol length of OFDM is carried out (Step S22), and pilot symbols are extracted (Step S23). Then, the extracted pilot symbols are verified with an already-known pattern, and an amplitude-phase variation of the symbols is calculated so as to obtain the channel estimation values (Step S24).

To measure a propagation delay time in accordance with the channel estimation values, the channel estimation values in the frequency domain is transformed into the time domain by means of IFFT (Step S26), and positions of power peaks are detected from a delay profile obtained (Step S27). Then, the propagation delay time can be calculated according to the positions of power peaks.

Moreover, with respect to a low-level part in the delay profile, by way of replacing values of the delay profile with "0" (Step S28) and transforming back into the frequency domain by using FFT (Step S29), it becomes possible to cancel noise components from the original channel estimation values.

At the time of carrying out IFFT with respect to channel estimation values in the frequency domain; the number of channel estimation values, namely pilot symbols, is sometimes not a power of 2. In such a case, IFFT of the number of samples of the channel estimation values is not carried out but IFFT of size larger than the number of samples of the channel estimation values is carried out. At the time, the channel estimation values are so placed as to fill a front end and its subsequent followers; and for any part with an insufficient number of samples is not filled with 0 but the channel estimation values are interpolated (Step S25). Thus, a signal power of a part with no propagation path decreases in the delay profile so that a canceling process on noise components can be improved (for example, refer to NPL 1).

Moreover, a technology of using an arrangement pattern of already-known samples, in which a noise effect is canceled by means of carrying out IFFT samples of the already-known pattern included in a received signal, is also known as a technology for calculating a delay profile (for example, refer to PTL 1).

CITATION LIST

Non Patent Literature

{NPL 1} Institute of Electronics, Information and Communication Engineers—General Conference, 2006; Lecture B-5-94

Patent Literature

{PTL 1} JP 2000-134176 A

SUMMARY OF INVENTION

Technical Problem

If an interpolation is carried out in such a way that the number of samples of channel estimation values in the frequency domain becomes a power of 2, and a delay profile is calculated by way of transforming into the time domain by means of IFFT, sometimes peaks of power that do not actually exist appear at a top position of the delay profile, owing to an effect of the interpolation. In that case, a propagation delay time cannot correctly be measured according to a position of power peak of the delay profile.

FIG. 19 shows an example of channel estimation values in the frequency domain. In FIG. 19 and other drawings for showing examples of channel estimation values in the frequency domain, an I-component and a Q-component are represented with a solid line and a broken line, respectively.

In the example of FIG. 19, there exist 200 channel estimation values, and then in order to carry out IFFT of 256 points, 56 points in the rear are filled with 0. As a result of carrying out IFFT with respect to the channel estimation values in the frequency domain shown in FIG. 19, a power delay profile is obtained as shown in FIG. 20. In the example of FIG. 20, there appear power peaks corresponding to a propagation path at the 24-th point and the 45-th point.

Being different from the case illustrated in FIG. 19 and FIG. 20 where the part with an insufficient number of samples is filled with 0, a case in which the part with an insufficient number of samples is interpolated is explained with respect to FIG. 21 and FIG. 22.

Among 56 points in the rear of the channel estimation values shown in FIG. 19; the 201-st point and the 202-nd point are extrapolated with values of the 199-th point and the 200-th point; the 255-th point and the 256-th point are extrapolated with values of the first point and the second point; and the 203-rd point through the 254-th point are interpolated with values of 202-nd point and the 255-th point, as shown in FIG. 21. Then, IFFT is carried out with respect to the channel estimation values after the interpolation shown in FIG. 21, and a power delay profile is obtained as shown in FIG. 22.

In the delay profile shown in FIG. 22, as a result of carrying out IFFT with respect to the channel estimation values after the interpolation, as shown in FIG. 21; a power around the 150-th point becomes low, and meanwhile a power peak appears at a top position of the delay profile, in comparison with FIG. 20. This is because the channel estimation values are interpolated with a smooth line in the frequency domain, and therefore a signal power owing to the interpolation concentrates at a top part and a tail part in the delay profile. Nevertheless, there actually exists no propagation path at the top position of the delay profile in this case example, as shown in FIG. 20. Namely, the power peak at the top position of the delay profile shown in FIG. 22 is a false power peak that appears owing to the interpolation process including the extrapolation and the interpolation, which are explained with reference to FIG. 21. In the case of measuring a propagation delay time according to a delay profile, the propagation delay time cannot be measured correctly if a false power peak exists as shown in FIG. 22.

Moreover, the technology described in PTL 1 mentioned above is a technology for canceling an unnecessary component in an impulse response of a dominant wave by using an arrangement pattern of an already-known sample, and it is not a technology for dealing with a false power peak in a delay profile, which appears in the case of interpolation for channel estimation values in the frequency domain as described above.

It is an objective of the present invention to provide a receiver device, a transmit/receive terminal, a propagation delay time measurement method, and a computer program for solving the issue described above and making it possible to correctly measure a propagation delay time without increasing the number of arithmetic operations.

Solution to Problem

In order to give a solution to the issue described above, a receiver device of the present invention is a receiver device receiving a signal transmitted by means of an orthogonal frequency division multiplexing system, which is characterized by comprising: a channel estimation means which calculates channel estimation values in the frequency domain based on pilot symbols arranged in orthogonal frequency division multiplexing subcarriers; an interpolation means which carries out an interpolation on the channel estimation values calculated by way of the channel estimation means to make the number of samples become a power of 2; a transforming means which transforms the channel estimation values, interpolated by the interpolation means, into the time domain to obtain a delay profile; and a power peak position detecting means which detects a power peak position in the delay profile to calculate a propagation delay time of the signal transmitted; wherein the power peak position detecting means refers to a signal power of a part interpolated by the interpolation means to detect an appropriate power peak position in the delay profile.

A transmit/receive terminal of the present invention is a transmit/receive terminal for transmitting and receiving data to/from a base station, which is characterised by comprising: a receiver device described above, as a receiving unit; and a means which adjusts a transmission timing to the base station, in accordance with the propagation delay time.

A propagation delay time measurement method of the present invention is a propagation delay time measurement method, with receiving a signal transmitted by means of an orthogonal frequency division multiplexing system and measuring a propagation delay time of the signal, which is characterized by including; a channel estimation step calculating channel estimation values in the frequency domain based on pilot symbols arranged in orthogonal frequency division multiplexing subcarriers; an interpolation step carrying out an interpolation on the channel estimation values calculated in the channel estimation step to make the number of samples become a power of 2; a transforming step transforming the channel estimation values, interpolated in the interpolation step, into the time domain to obtain a delay profile; and a power peak position detecting step detecting a power peak position in the delay profile to calculate a propagation delay time of the signal transmitted; wherein the power peak position detecting step refers a signal power of a part interpolated in the interpolation step to detect an appropriate power peak position in the delay profile.

A computer program of the present invention is characterized by, when the computer program is installed in a computer of a receiver device to receive a signal transmitted by means of an orthogonal frequency division multiplexing system, making the computer execute a channel estimation step calculating channel estimation values in the frequency domain based on pilot symbols arranged in orthogonal frequency division multiplexing subcarriers; an interpolation step carrying out an interpolation on the channel estimation values calculated in the channel estimation step to make the number of samples become a power of 2; a transforming step transforming the channel estimation values, interpolated in the interpolation step, into the time domain to obtain a delay profile; and a power peak position detecting step detecting a power peak position in the delay profile to calculate a propagation delay time of the signal transmitted; wherein the power peak position detecting step refers a signal power of a part interpolated in the interpolation step to detect an appropriate power peak position in the delay profile.

Advantageous Effects of Invention

According to the present invention, a propagation delay time can correctly be measured.

DESCRIPTION OF EMBODIMENTS

Figure 1:
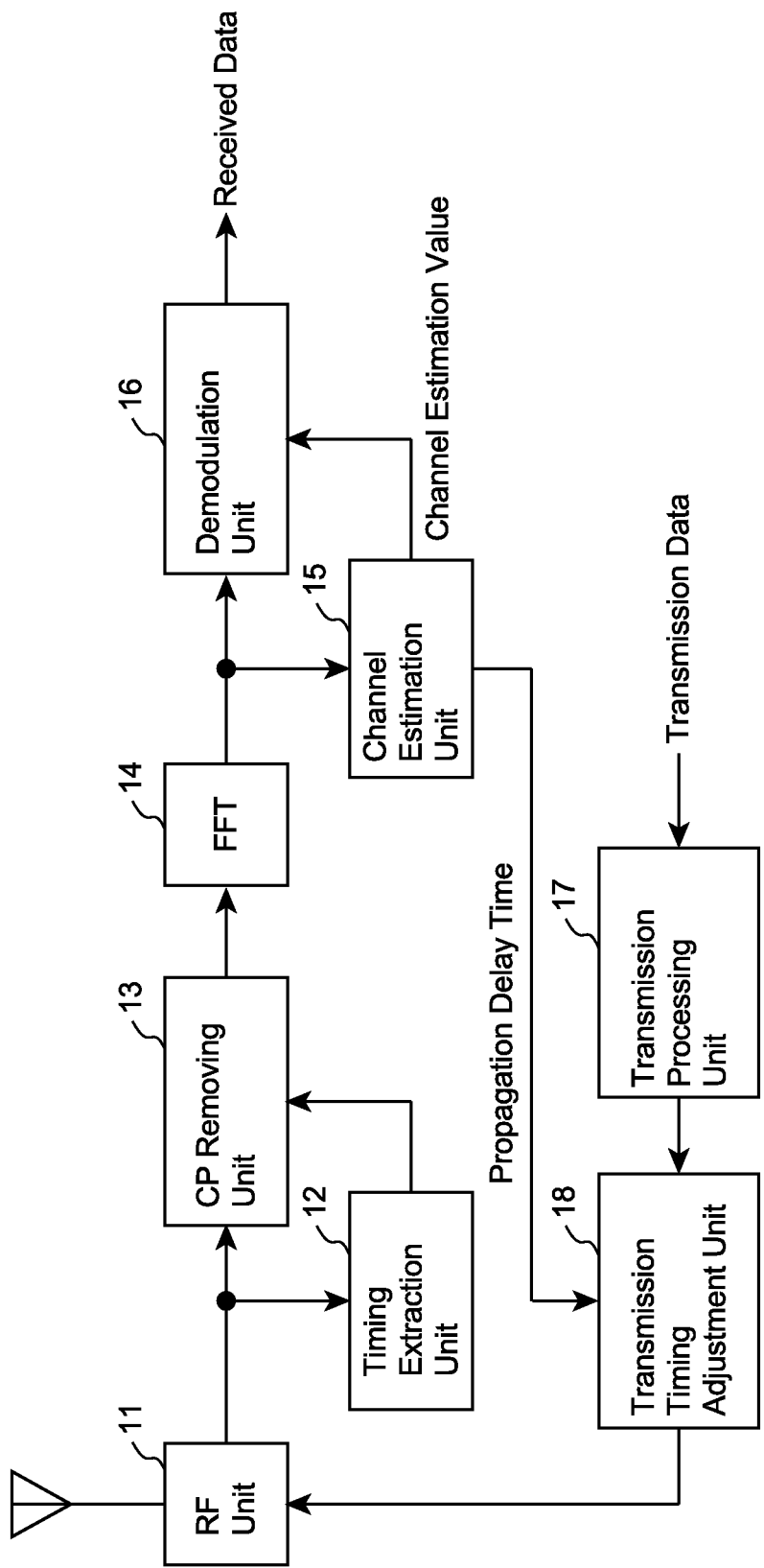
FIG. 1 is a diagram for explaining a configuration of a transmit/receive terminal.

A transmit/receive terminal according to an exemplified embodiment of the present invention is explained below with reference to FIG. 1 through FIG. 12, and FIGS. 21 and 22 described above. Incidentally, the transmit/receive terminal is equipped with a configuration unit in relation to processing of received data and creating data to be transmitted, and the configuration unit is publicly-known and therefore an explanation about the unit is omitted here.

The transmit/receive terminal, as a receiving unit or a receiver device, includes: an RF (Radio Frequency) unit 11, a timing extraction unit 12, a CP (Cyclic Prefix) removing unit 13, an FFT unit 14, a channel estimation unit 15, and a demodulation unit 16. Furthermore, the transmit/receive terminal shares the RF unit 11, as a part of a transmitting unit or a transmitting device, in common with a receiving unit or a receiver device; and includes a transmission processing unit 17 and a transmission timing adjustment unit 18.

The RF unit 11 receives a downlink signal and supplies it to the timing extraction unit 12 and the CP removing unit 13, and in the meantime, transmits an uplink signal according to a timing adjusted by the transmission timing adjustment unit 18. The timing extraction unit 12 extracts a timing, at which a received signal becomes a maximum, from the received signal supplied from the RF unit 11, and supplies the timing to the CP removing unit 13. The timing, at which a received signal becomes a maximum, is consistent with a propagation time if a propagation environment is a single path; and meanwhile in a complicated propagation environment, the timing is not necessarily consistent with the propagation time. The CP removing unit 13 removes CP (Cyclic Prefix) from the received signal supplied from the RF unit 11, in accordance with the timing supplied from the timing extraction unit 12, and supplies a processed signal to the FFT unit 14. Then, the FFT unit 14 carries out FFT with respect to the received signal, after removing CP, supplied from the CP removing unit 13, in accordance with an effective symbol length of OFDM, in order to transform the signal into the frequency domain; and supplies a processed signal to the channel estimation unit 15 and the demodulation unit 16. The channel estimation unit 15 calculates channel estimation values, on the basis of pilot symbols being inserted at specific time-wise and frequency-wise positions; the pilot symbols being out of the signal supplied from the FFT unit 14 and deployed in the frequency domain; and then supplies the channel estimation values to the demodulation unit 16. Moreover, the channel estimation unit 15 calculates a delay profile to measure a propagation delay time, and supplies a calculated result to the transmission timing adjustment unit 18. In the meantime, the demodulation unit 16 demodulates a data part, by using the channel estimation values calculated in the channel estimation unit 15; the data part being out of the signal supplied from the FFT unit 14 and deployed in the frequency domain.

The transmission processing unit 17 converts data to be transmitted into an uplink signal; and supplies the uplink signal to the transmission timing adjustment unit 18. The transmission timing adjustment unit 18 supplies the uplink signal supplied from the transmission processing unit 17 to the RF unit 11, while putting a transmission timing ahead a period of the propagation delay time supplied from the channel estimation unit 15.

Figure 2:
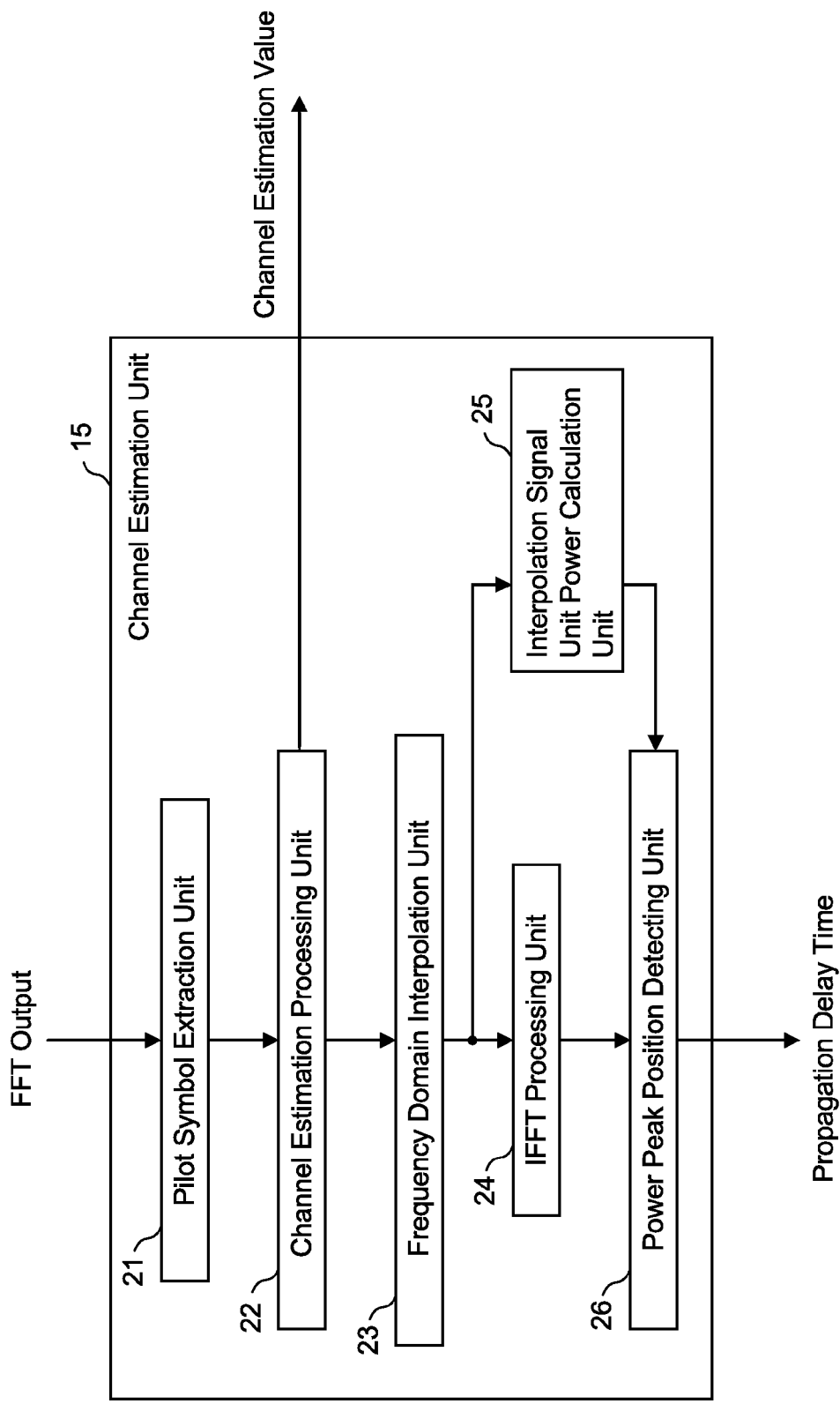
FIG. 2 is a diagram for explaining a channel estimation unit.

The channel estimation unit 15, which is included in the transmit/receive terminal explained with reference to FIG. 1 and executes a measuring process of a propagation delay time, is explained next with reference to FIG. 2

The channel estimation unit 15 includes a pilot symbol extraction unit 21, a channel estimation processing unit 22, a frequency domain interpolation unit 23, an IFFT processing unit 24, an interpolation signal unit power calculation unit 25, and a power peak position detecting unit 26.

The pilot symbol extraction unit 21 extracts pilot symbols from the signal in the frequency domain, output from the FFT unit 14, and supplies the pilot symbols to the channel estimation processing unit 22. The channel estimation processing unit 22 verifies the pilot symbols, extracted by the pilot symbol extraction unit 21, with a known pattern in order to execute a channel estimation; and supplies the obtained channel estimation values to the frequency domain interpolation unit 23, and also supplies the same to the demodulation unit 16 described above.

With respect to the channel estimation values obtained by way of processing of the channel estimation processing unit 22, the frequency domain interpolation unit 23 executes interpolation for a part with an insufficient number of samples of the channel estimation values in the frequency domain so that the number of samples of the channel estimation values becomes a power of 2, for example, in such a way as already explained with reference to FIG. 21. Herewith, an explanation is made on an assumption that the channel estimation values after the interpolation described above with reference to FIG. 21 are obtained. The frequency domain interpolation unit 23 supplies the obtained channel estimation values to the IFFT processing unit 24 and the interpolation signal unit power calculation unit 25.

The IFFT processing unit 24 carries out IFFT with respect to the channel estimation values for which the frequency domain interpolation unit 23 has interpolated in the frequency domain, in order to obtain a delay profile. Herewith, an explanation is made on an assumption that the delay profile described above with reference to FIG. 21 are obtained. The IFFT processing unit 24 supplies the obtained delay profile to the power peak position detecting unit 26.

Figure 3:
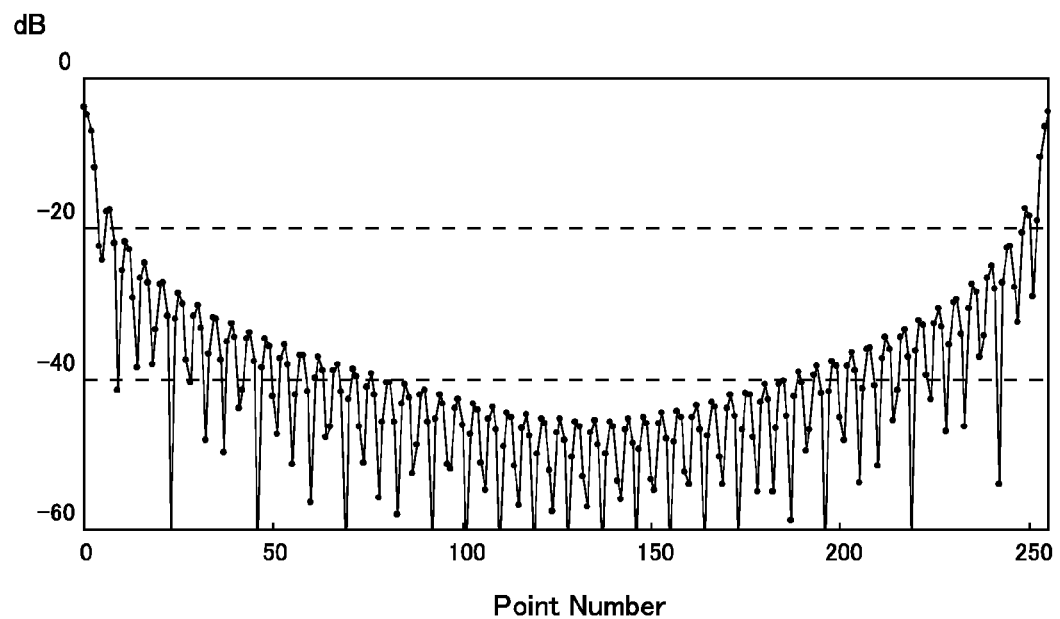
FIG. 3 is a diagram that shows a signal power in the time domain, which is obtained by means of IFFT with respect to an interpolated waveform.

The interpolation signal unit power calculation unit 25 carries out IFFT of the same size as the delay profile with respect to a signal of the interpolated part in order to calculate a signal power. Concretely to describe, the interpolation signal unit power calculation unit 25 calculates a signal power in the time domain, of the interpolated part in the frequency domain, for which the frequency domain interpolation unit 23 has executed interpolation. As a method of calculating the signal power in the time domain, in relation to the interpolated part, for example, there is a method in which IFFT of the same size as the delay profile is carried out with respect to a waveform of the interpolated part in order to transform the waveform into the time domain. Shown in FIG. 3 is a signal power in the time domain, which has been calculated by carrying out IFFT with respect to the waveform of the interpolated part shown in FIG. 21 (from the 201-st point to the 256-th). The interpolation signal unit power calculation unit 25 supplies the calculated signal power of the interpolated part to the power peak position detecting unit 26.

The power peak position detecting unit 26 detects a power peak value by way of subtracting the signal power of the interpolated part from the delay profile calculated by way of IFFT. Concretely to describe, the power peak position detecting unit 26 obtains a power waveform shown in FIG. 4, by subtracting the signal power in the time domain of the interpolated part shown in FIG. 3, supplied by the interpolation signal unit power calculation unit 25, from the delay profile supplied by the IFFT processing unit 24. A propagation delay time can be calculated by way of detecting a power peak position in the power waveform.

Figure 4:
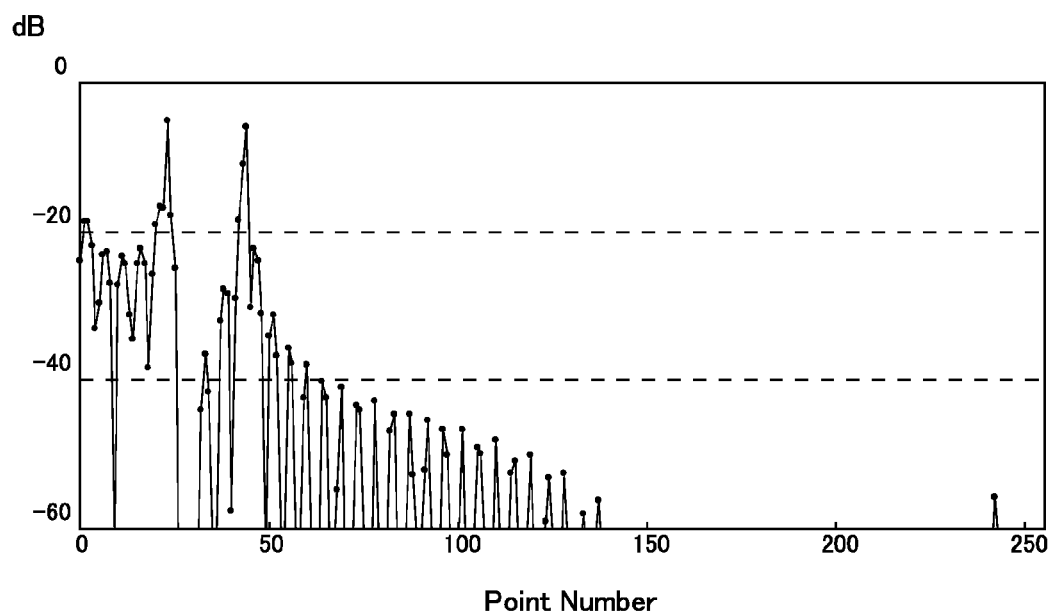
FIG. 4 is a diagram that shows an example of a power delay profile obtained as a result of subtracting a signal power in the time domain of an interpolated part shown in FIG. 3, from a power delay profile shown in FIG. 22.
Figure 21:
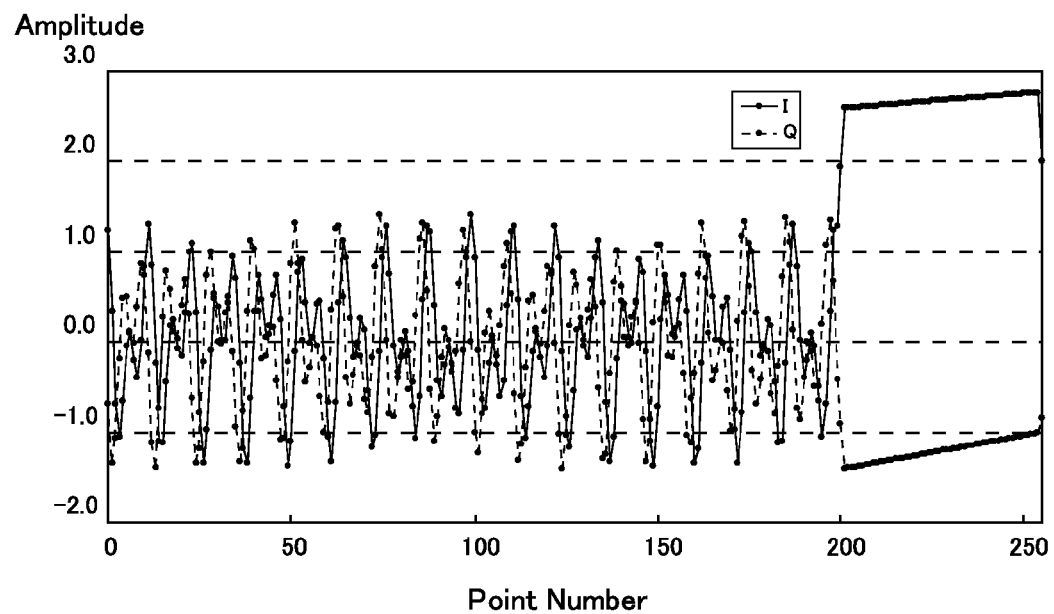
FIG. 21 is a diagram that shows an example of channel estimation values in the frequency domain, in the case where an interpolation process has been carried out.
Figure 22:
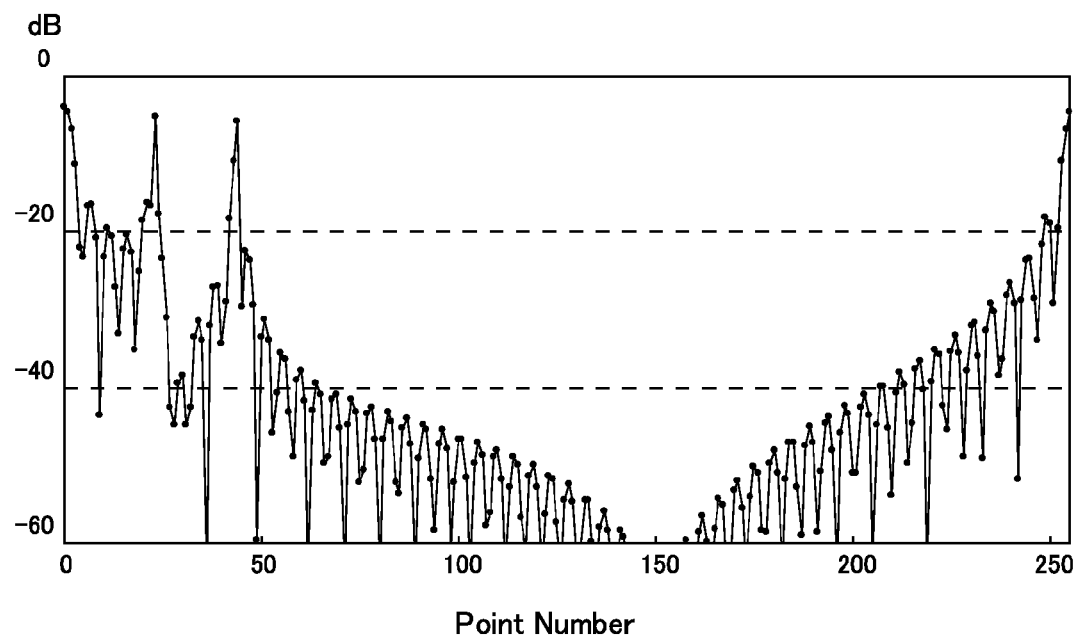
FIG. 22 is a diagram that shows an example of a power delay profile, in the case where an interpolation process has been carried out.

In other words, FIG. 4 shows a result of subtracting the power value of FIG. 3 from the power value of FIG. 21, the subtraction result being represented in dB. If the power value of FIG. 3 is greater than the value of FIG. 21, the power value is made 0, and it is illustrated with a negative lower limit value in FIG. 4. Measuring a peak position by using FIG. 4 leads to no risk of incorrect measurement of the propagation delay time owing to a false power peak that appears at a top position of the delay profile. Even in the case of interpolating a channel estimation value, the channel estimation unit 15 can correctly measure the propagation delay time without making a mistake in measurement of the propagation delay time.

Figure 5:
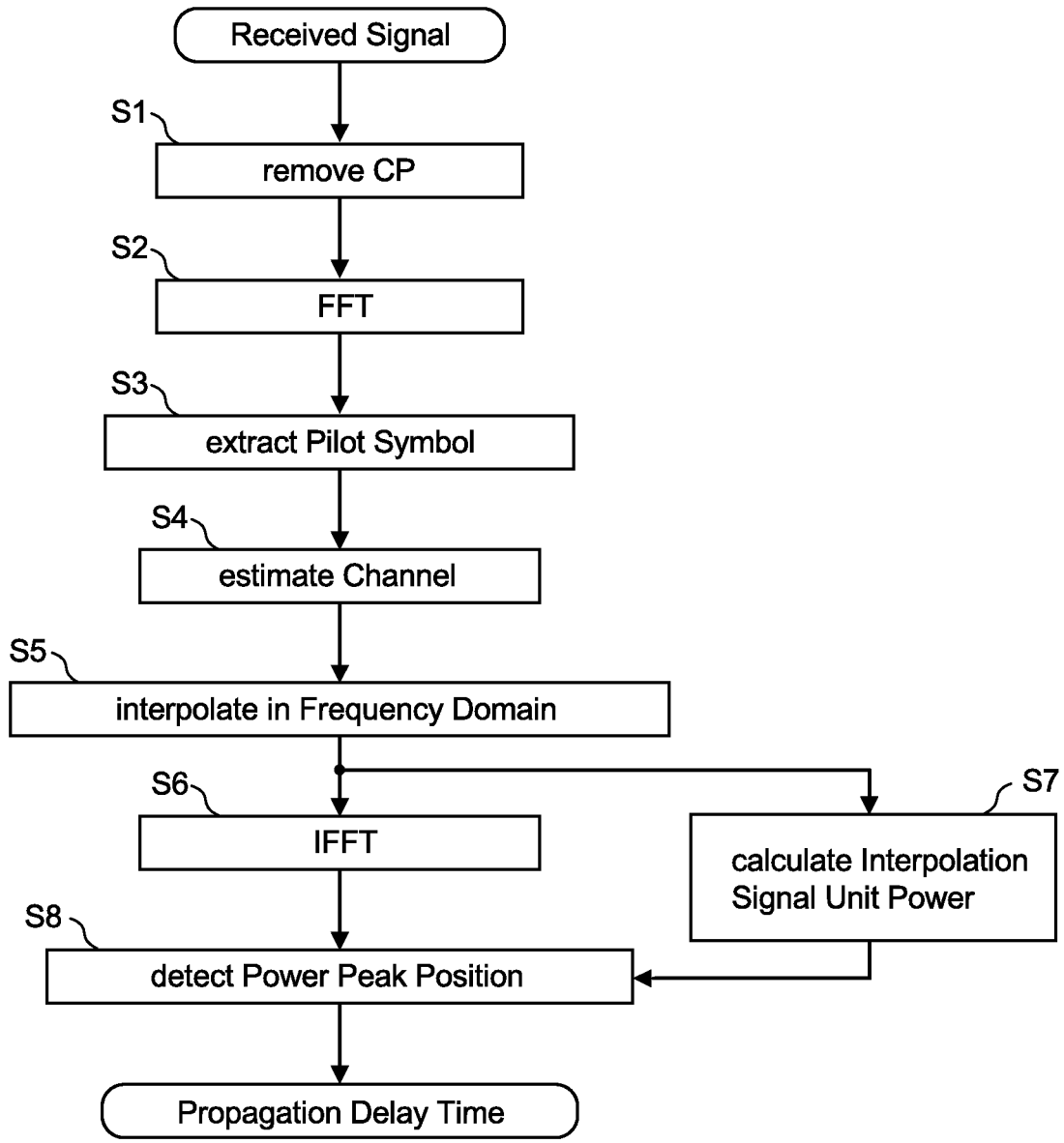
FIG. 5 is a flowchart that explains a process to be executed by the transmit/receive terminal.

Processing by the transmit/receive terminal in relation to the measurement of the propagation delay time is explained next with reference to a flow chart of FIG. 5. The processing explained here includes not only processing by the channel estimation unit 15 but also processing by the timing extraction unit 12, the CP removing unit 13, and the FFT unit 4.

If the RF unit 11 receives a downlink signal, the CP removing unit 13 removes CP (Cyclic Prefix) from the received signal in accordance with the timing supplied from the timing extraction unit 12 (Step S1). Then, the FFT unit 14 carries out FFT with respect to the received signal, after removing CP, in accordance with an effective symbol length of OFDM (Step S2).

The pilot symbol extraction unit 21 in the channel estimation unit 15 extracts pilot symbols from the signal in the frequency domain, output from the FFT unit 14 (Step S3). The channel estimation processing unit 22 verifies the pilot symbols, extracted by the pilot symbol extraction unit 21, with an already-known pattern in order to execute a channel estimation (Step S4). With respect to the channel estimation values obtained by way of processing of the channel estimation processing unit 22, the frequency domain interpolation unit 23 executes interpolation in the frequency domain in such a way that the number of samples of the channel estimation values becomes a power of 2 (Step S5). The IFFT processing unit 24 carries out IFFT with respect to the channel estimation values for which the frequency domain interpolation unit 23 has interpolated in the frequency domain (Step S6), in order to obtain a delay profile.

The interpolation signal unit power calculation unit 25 carries out IFFT of the same size as the delay profile with respect to a waveform of the interpolated part in the frequency domain, for which the frequency domain interpolation unit 23 has executed interpolation, so as to transform the signal into the time domain for calculating the signal power of the part (Step S7). The power peak position detecting unit 26 detects a power peak position of the delay profile to calculate a propagation delay time of the transmitted signal (Step S8). At the time, the power peak position detecting unit 26 detects an appropriate power peak position in the delay profile at Step S8, with reference to the signal power of the part interpolated at Step S7.

Processing by the channel estimation unit 15 in the case where a propagation path exists at a top of a delay profile is explained next with reference to a flow chart of FIG. 6 through FIG. 11.

Figure 6:
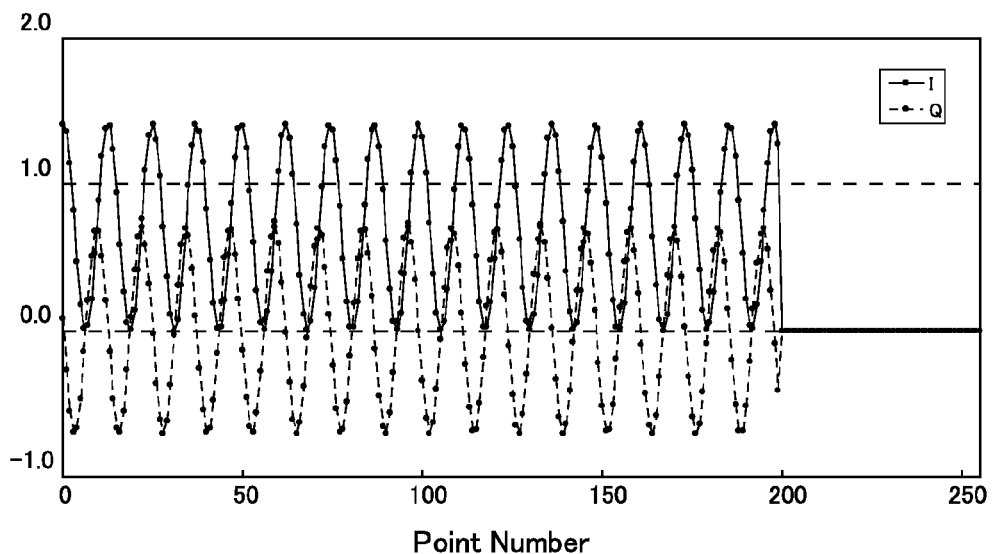
FIG. 6 is a diagram that shows an example of channel estimation values in the frequency domain in the case where a propagation path exists at a top of a delay profile.
Figure 7:
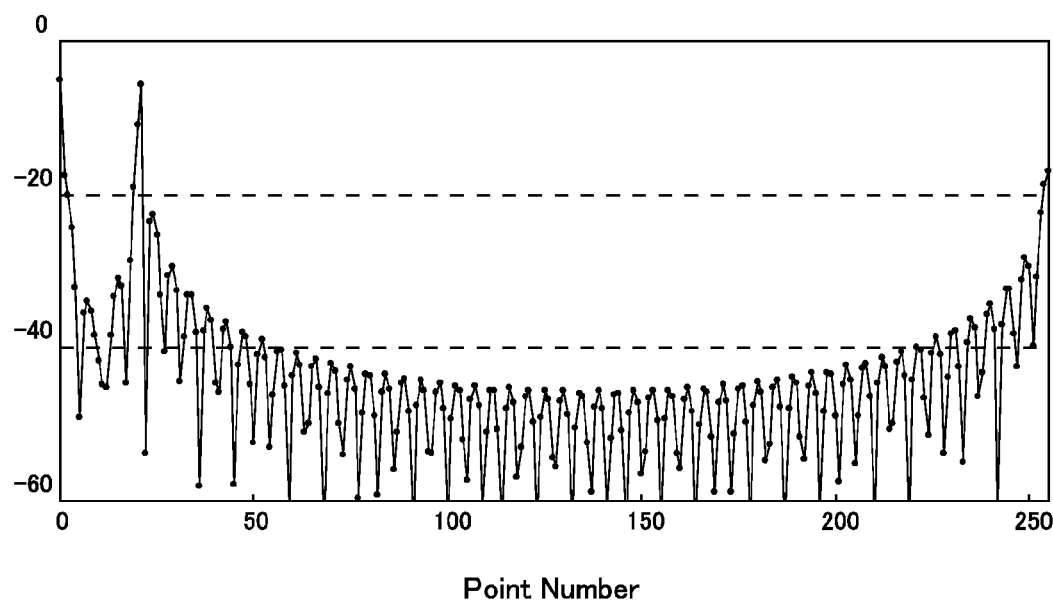
FIG. 7 is a diagram that shows an example of a power delay profile in the case where a propagation path exists at a top of a delay profile.

FIG. 6 shows an example of channel estimation values in the frequency domain in the case where a propagation path exists at a top of a delay profile. There are 200 channel estimation values, and in order to carry out IFFT of 256 points, 56 points in the rear are filled with 0. Carrying out IFFT with respect to the signal shown in FIG. 6 results in a power delay profile shown in FIG. 7. In this case example, power peaks corresponding to the propagation path exist at the first point and the 22-nd point.

Meanwhile, explained next is a case where the channel estimation unit 15 measures a propagation delay time.

Figure 8:
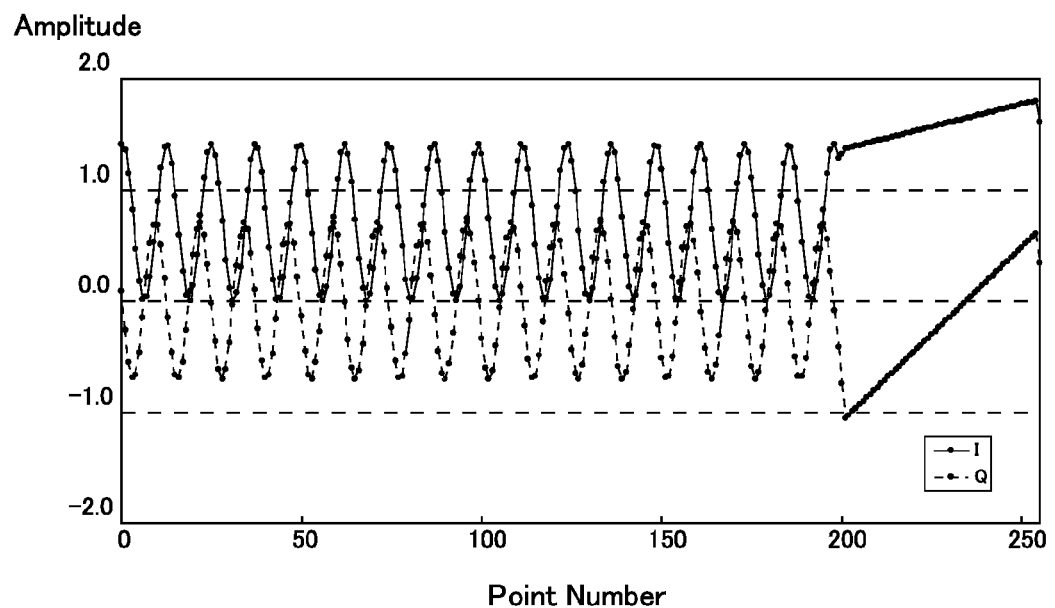
FIG. 8 is a diagram that shows an example of channel estimation values in the frequency domain in the case where an interpolation has been carried out.

FIG. 8 shows a waveform in the case where, in the frequency domain interpolation unit 23, among 56 points in the rear of the channel estimation values shown in FIG. 6, the 201-st point and the 202-nd point are extrapolated with values of the 199-th point and the 200-th point, the 255-th point and the 256-th point are extrapolated with values of the first point and the second point, and the 203-rd point through the 254-th point are interpolated with values of 202-nd point and the 255-th point.

Figure 9:
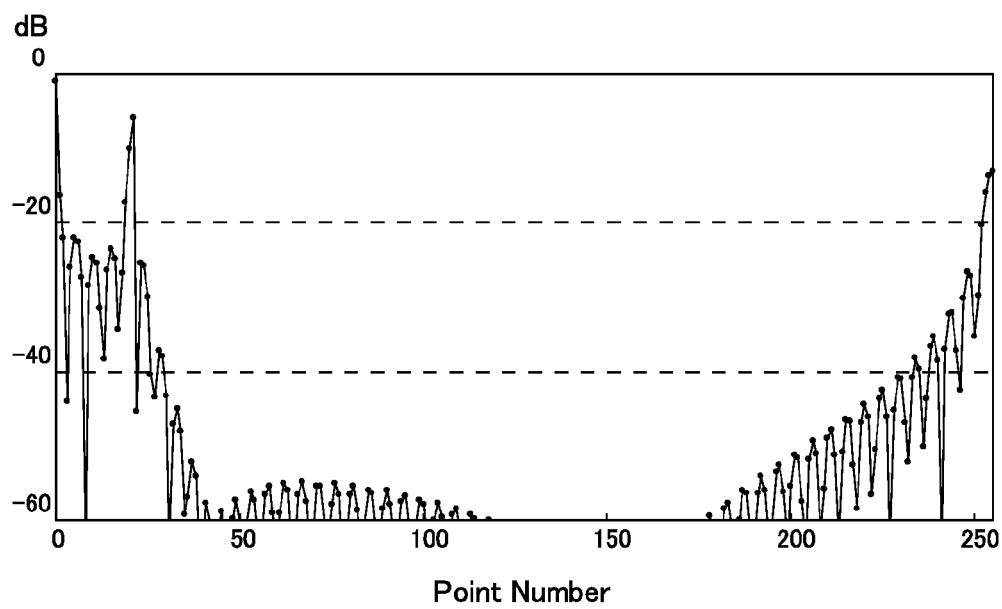
FIG. 9 is a diagram that shows an example of a power delay profile in the case where an interpolation has been carried out.

If the IFFT processing unit 24 carries out IFFT with respect to the signal shown in FIG. 8, a power delay profile shown in FIG. 9 is obtained. FIG. 9 shows a lower power around the 150-th point, in comparison with a case of FIG. 7.

Figure 10:
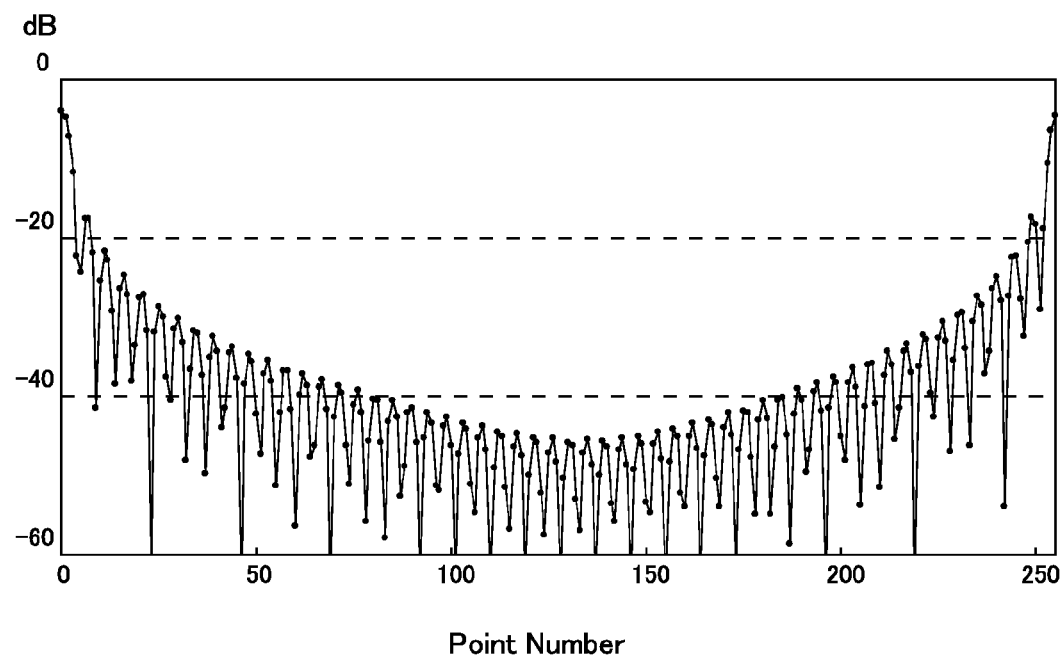
FIG. 10 is a diagram of a signal power in the time domain of an interpolation signal from the 201-st point to the 256-th point in FIG. 8.

FIG. 10 is a power delay profile of the interpolation signal of the part from the 201-st point to the 256-th point in FIG. 8, obtained in the interpolation signal unit power calculation unit 25.

Figure 11:
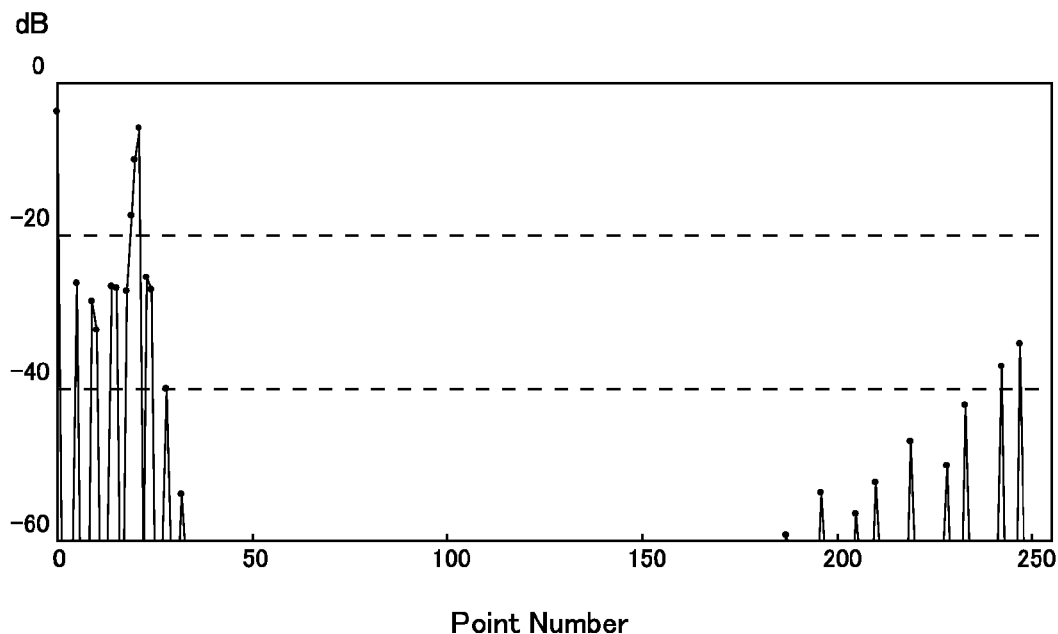
FIG. 11 is a diagram that shows an example of a power delay profile obtained as a result of subtracting a signal power in the time domain of an interpolated part shown in FIG. 10, from the delay profile shown in FIG. 9.

The power peak position detecting unit 26 can obtain a power waveform shown in FIG. 11, by subtracting power values of FIG. 10 from those of FIG. 9. In the power waveform shown in FIG. 11, a propagation path existing at a top of the delay profile can be detected as a power peak position.

In the case where a false power peak caused by processing of extrapolation & interpolation appears at a top position, as already explained with reference to FIG. 19 through FIG. 22, the power peak position detecting unit 26 can delete the false peak part, as explained with reference to FIG. 3 and FIG. 4. Moreover, the power peak position detecting unit 26 has no risk of overlooking a propagation path existing at a top position of a delay profile, as observed in FIG. 6 through FIG. 11, even if the propagation path exists at the top position of the delay profile.

As described above, owing to the interpolation of the channel estimation values in the frequency domain at the time of measuring a propagation delay time by using a delay profile obtained as a result of carrying out IFFT with respect to the channel estimation values, a top part and a tail part in the delay profile have a high power. Fortunately, according to the embodiment described above, the propagation delay time can correctly be measured without making a mistake in measuring the propagation delay time in relation to such a phenomenon of the delay profile.

As another method of calculating a signal power in the time domain of an interpolated part, it is also possible to make a calculation with respect to only a top part in a time-wise waveform. This is because a smooth waveform is used for the interpolated part, and it is not needed to carry out IFFT with respect to an entire part of a time-wise waveform after transforming a waveform of an interpolated part in the frequency domain into the time domain. This method is explained below with reference to FIG. 12 and FIG. 13.

Figure 12:
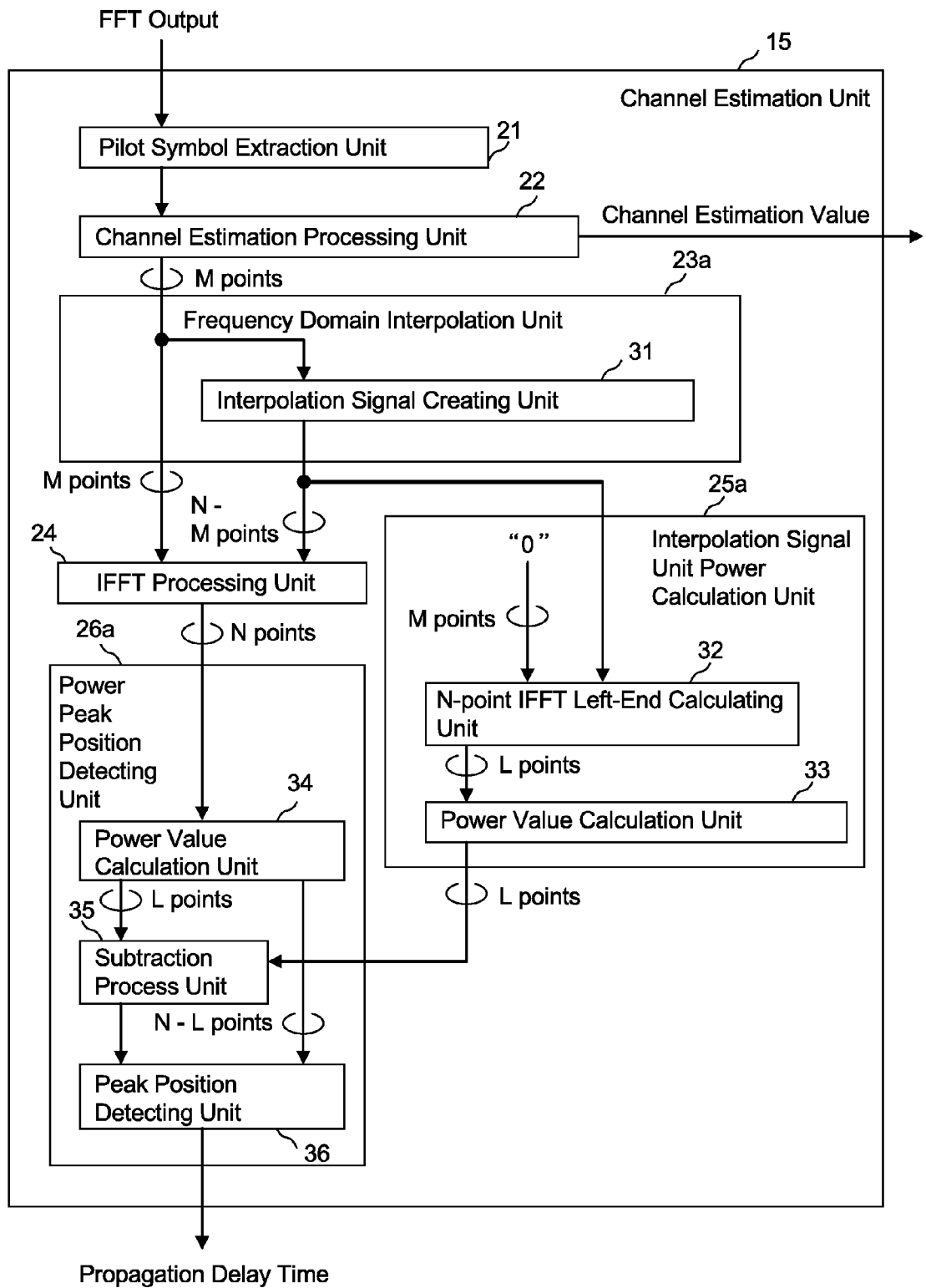
FIG. 12 is a diagram for explaining a variation example of a channel estimation unit.
Figure 13:
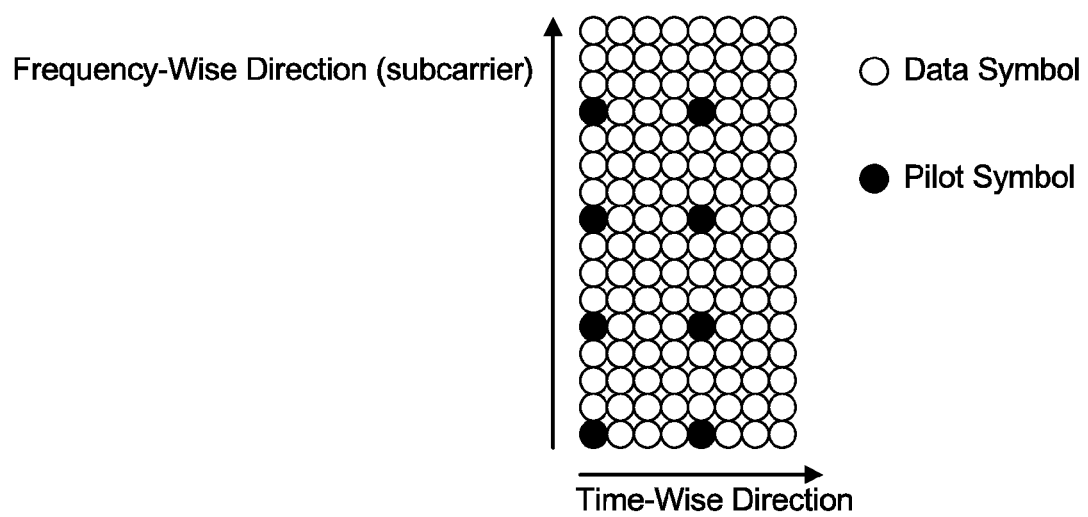
FIG. 13 is a diagram for explaining pilot symbols.
Figure 14:
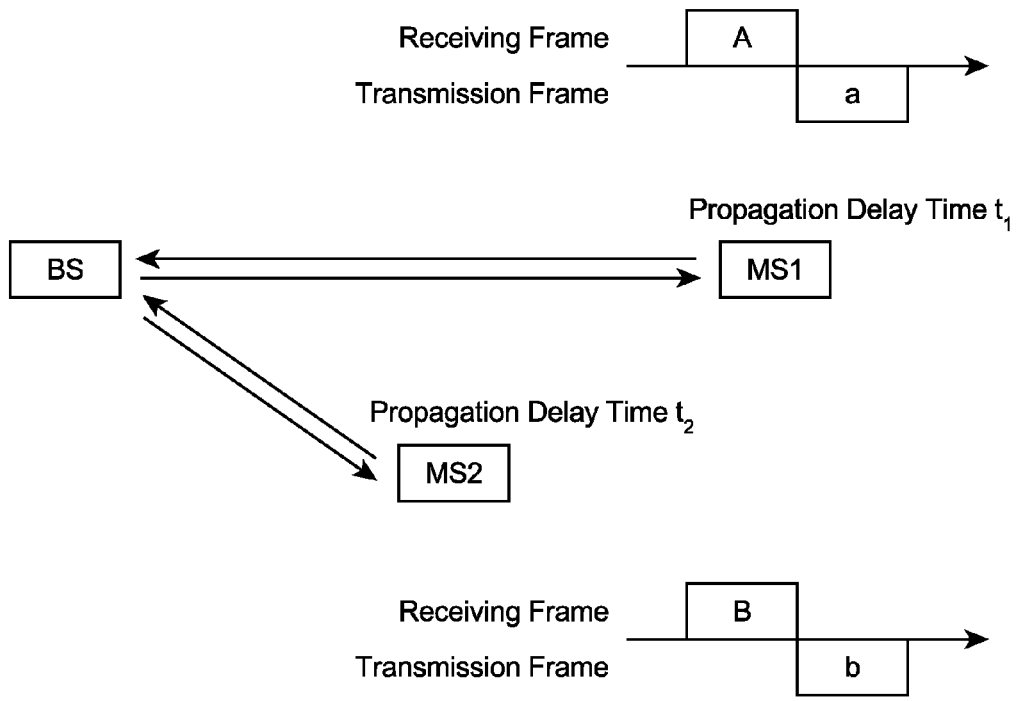
FIG. 14 is a diagram for explaining transmission/receiving of information in the case where a mobile station makes no adjustment on transmission timing.
Figure 15:
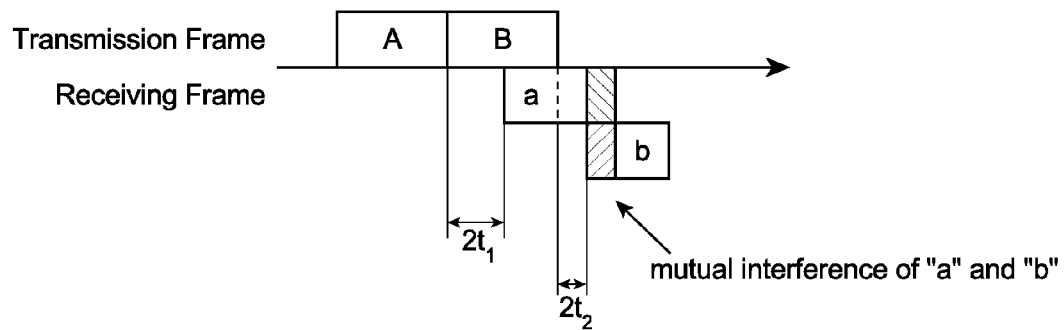
FIG. 15 is a diagram for explaining transmission/receiving of information in the case where a mobile station makes no adjustment on transmission timing.
Figure 16:
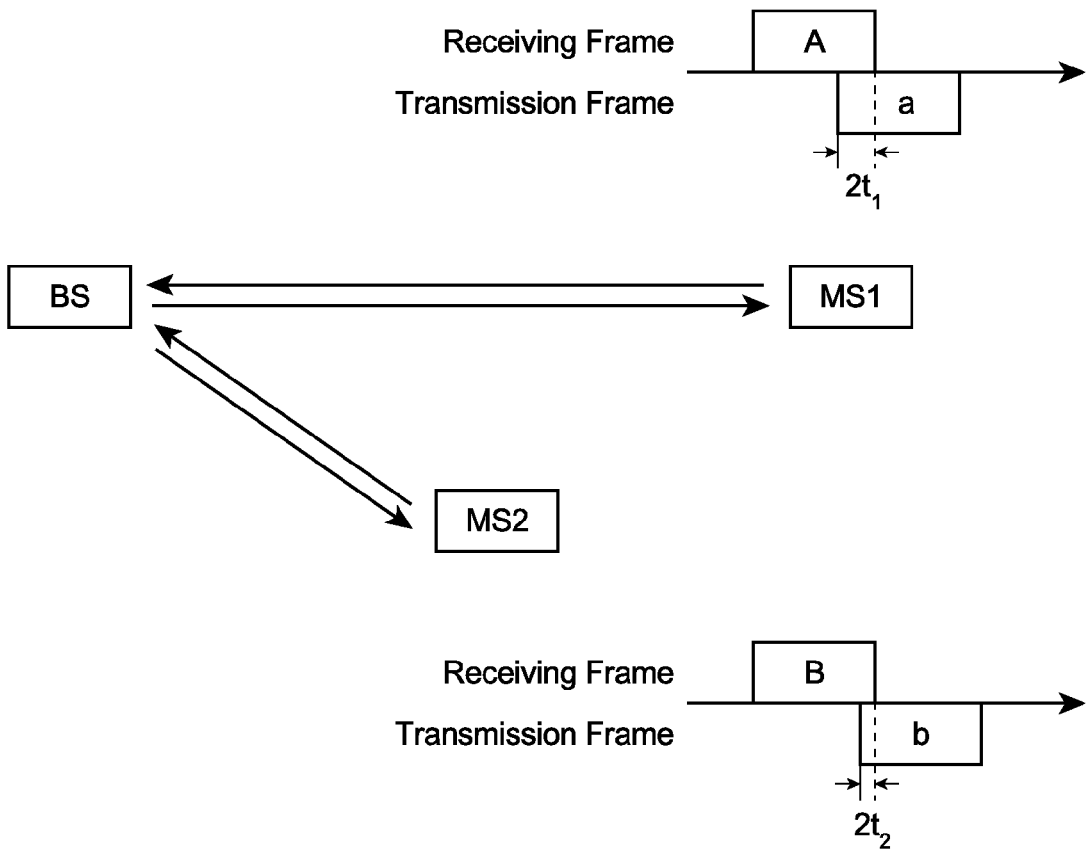
FIG. 16 is a diagram for explaining a case in which a mobile station makes an adjustment on transmission timing in order for transmission, on the basis of a measurement result of a propagation delay time.
Figure 17:
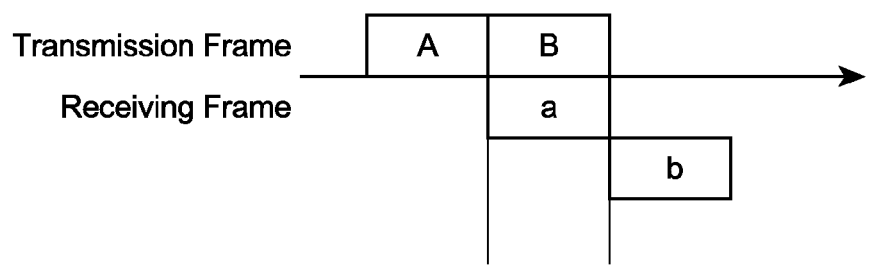
FIG. 17 is a diagram for explaining a case in which a mobile station makes an adjustment on transmission timing in order for transmission, on the basis of a measurement result of a propagation delay time.
Figure 18:
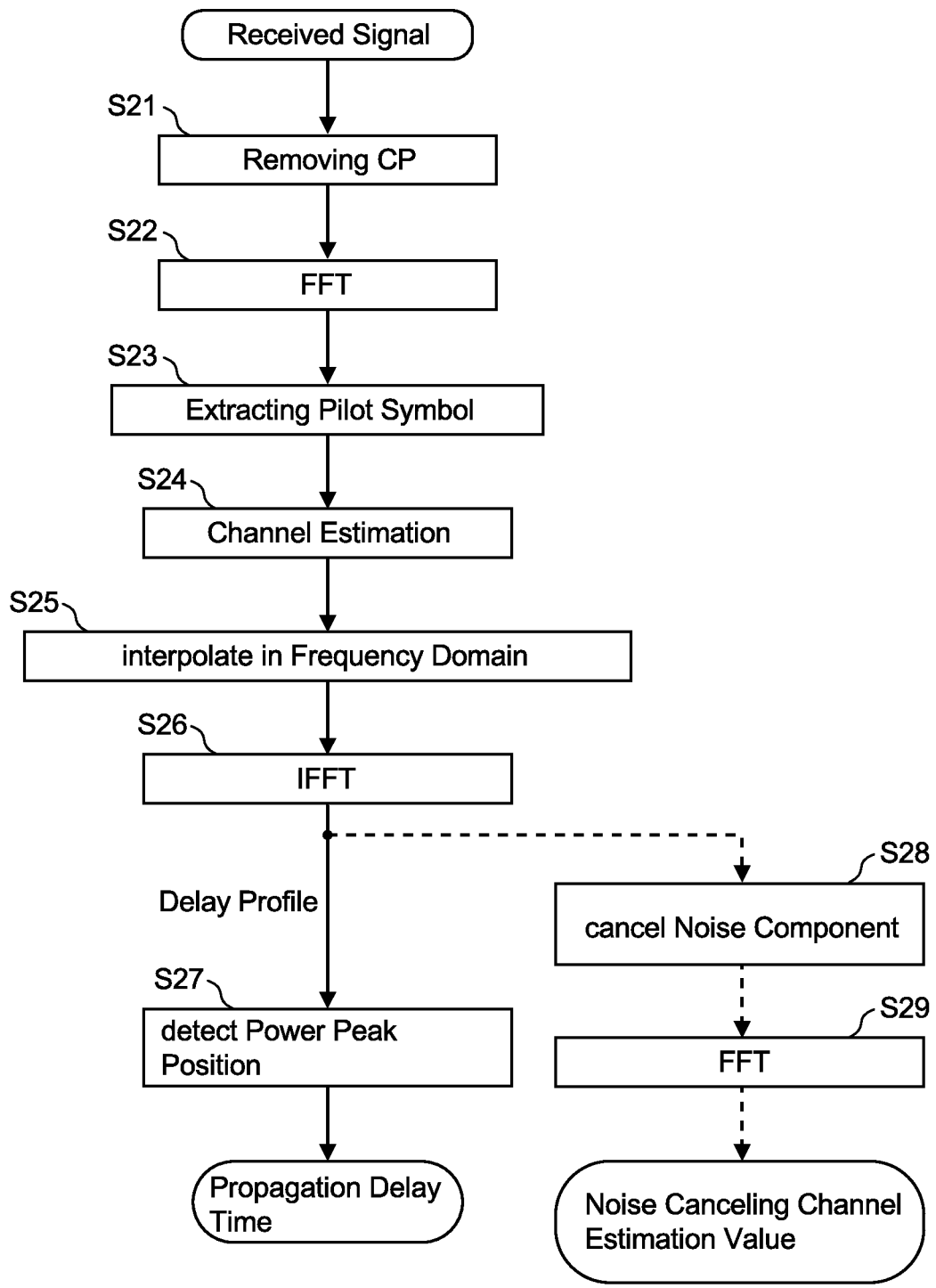
FIG. 18 is a diagram for explaining a conventional way of processing.
Figure 19:
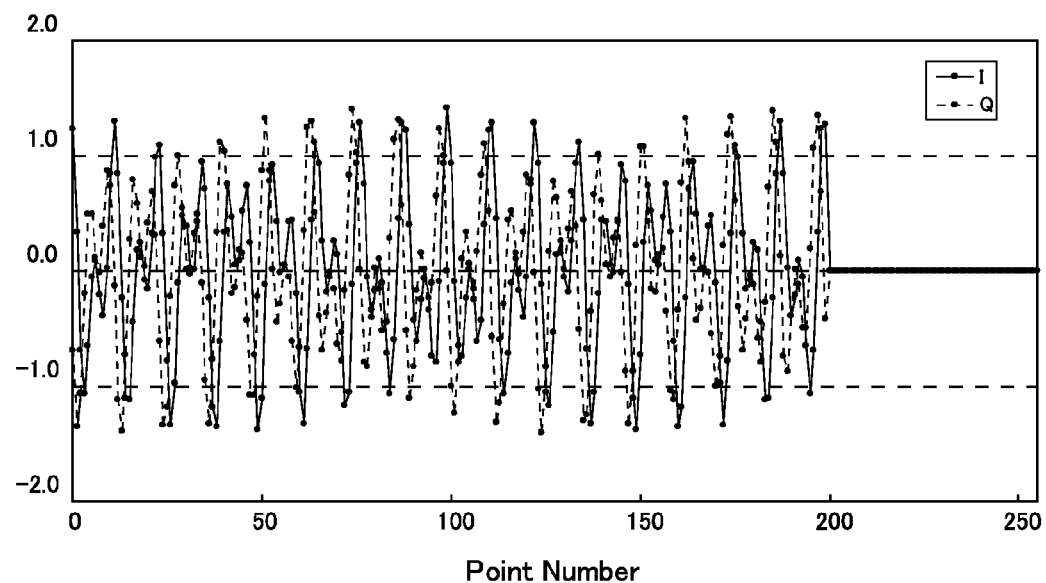
FIG. 19 FIG. 19 is a diagram that shows an example of channel estimation values in the frequency domain.
Figure 20:
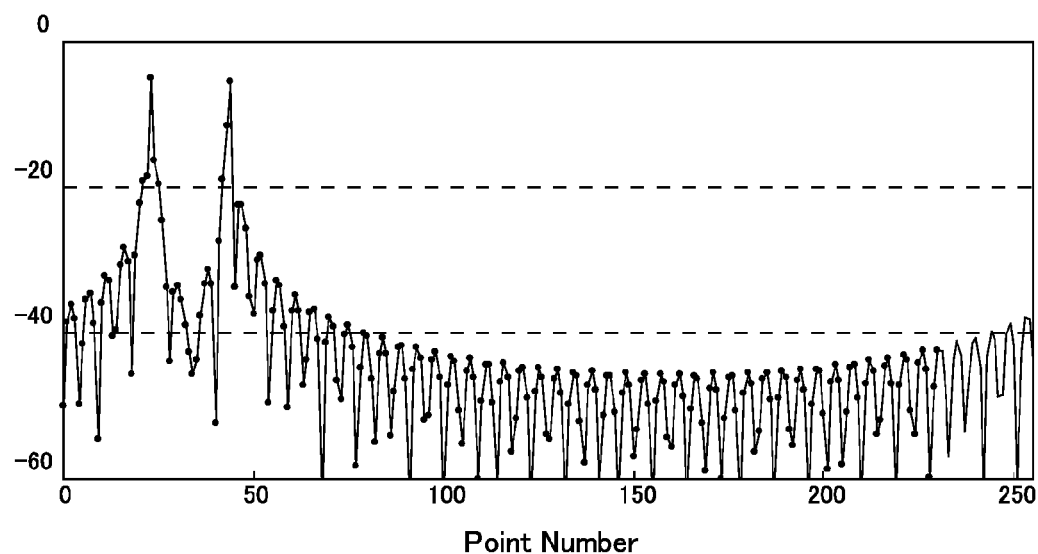
FIG. 20 is a diagram that shows an example of a power delay profile.

FIG. 12 shows a variation example of the channel estimation unit 15. In this variation example, a configuration shown in FIG. 2 is modified for processing by using only a top part in a time-wise waveform of an interpolated part. This channel estimation unit 15 includes a pilot symbol extraction unit 21, a channel estimation processing unit 22, and an IFFT processing unit 24 in the same way as the configuration shown in FIG. 2. Moreover, the channel estimation unit 15 includes a frequency domain interpolation unit 23a instead of the frequency domain interpolation unit 23 shown in FIG. 2, an interpolation signal unit power calculation unit 25a instead of the interpolation signal unit power calculation unit 25, and a power peak position detecting unit 26a instead of the power peak position detecting unit 26. In this case, an explanation is made on an assumption that the number of channel estimation values is 'M', and IFFT with respect to data of 'N' points is carried out to transform into the time domain. Herein, 'M' is smaller than 'N'.

The frequency domain interpolation unit 23a includes an interpolation signal creating unit 31. The interpolation signal creating unit 31 receives channel estimation values of 'M' points in the frequency domain, from the channel estimation processing unit 22, and the channel estimation values are interpolated rightward for 'N−M' points. An interpolation signal of the 'N−M' points is supplied together with the channel estimation values of 'M' points in the frequency domain, to the IFFT processing unit 24; and in the meantime, only the interpolation signal is supplied to the interpolation signal unit power calculation unit 25a.

The IFFT processing unit 24 carries out IFFT with respect to the channel estimation values of 'M' points in the frequency domain, which are supplied from the frequency domain interpolation unit 23a, and the interpolation signal of the 'N−M' points, in order to obtain a delay profile. Then, the delay profile is supplied to the power peak position detecting unit 26a.

The interpolation signal unit power calculation unit 25a includes an N-point IFFT left-end calculating unit 32 and a power value calculation unit 33. The N-point IFFT left-end calculating unit 32 receives an input of the interpolation signal of the 'N−M' points from the frequency domain interpolation unit 23a, and makes a calculation for a left end part of 'L' points out of IFFT for a size of 'N' points. Thus, a delay profile for the left end part of 'L' points in the case of IFFT with respect to the interpolation signal is obtained. By using the delay profile, the power value calculation unit 33 obtains a power value of each point in the left end part of 'L' points in the case of IFFT with respect to the interpolation signal. The power value is supplied to the power peak position detecting unit 26a.

The power peak position detecting unit 26a includes a power value calculation unit 34, a subtraction processing unit 35, and a peak position detecting unit 36. The power value calculation unit 34 calculates a power value of the delay profile of 'N' points, supplied from the IFFT processing unit 24. The subtraction processing unit 35 subtracts a power value of each point of the left-end 'L' points of the interpolation signal supplied from the interpolation signal unit power calculation unit 25a, from power values of predetermined 'L' points from a left end of the delay profile supplied from the power value calculation unit 34. The peak position detecting unit 36 detects a peak position on the basis of the power values of 'L' points supplied from the subtraction processing unit 35, and power values of right-end 'N−L' points out of the power values of 'N' points supplied from the power value calculation unit 34. In other words, the peak position detecting unit 36 replaces power values of left-end 'L' points out of the power values of 'N' points supplied from the power value calculation unit 34, with the power values of 'L' points supplied from the subtraction processing unit 35, and detects a peak position in this waveform.

What extent of a top part of a power delay profile should be calculated as the 'L' points depends on a ratio between the interpolated part and the IFFT size, and a smoothness of the interpolated waveform. For example, in the case where the interpolated part is in a range from ⅕ to ¼ of the IFFT size, the extent should preferably be around 1/64 of the IFFT size. If the IFFT size is 256, the extent should be about four samples. Meanwhile, if the interpolated part is close to ½ of the IFFT size, a calculation should be made with respect to two to three samples at a top part of the time-wise waveform. In another case, if the interpolated part is small enough in proportion to the IFFT size, a signal power of the interpolated part may not be taken into consideration.

In the case where no propagation path obviously exists at a top part of the delay profile, a propagation delay time may as well be measured without a calculation of a signal power with respect to the interpolated part, ignoring the top part of the delay profile.

In order to measure a propagation delay time, without using a delay profile for which channel estimation values are interpolated in the frequency domain for cancelling noise components of the channel estimation values, the propagation delay time may be measured by way of separately calculating a delay profile for which IFFT is carried out without interpolating the channel estimation values in the frequency domain.

In the embodiment described above, the explanation is made by using a case example in which the present invention is applied to a transmit/receive terminal. The present invention is not limited to such a transmit/receive terminal but may widely be applied as well to a receiver device using OFDM as a communication method, a transmit/receive system or a receiving terminal having such a receiver device, and the like.

The series of processes described above may be executed by means of hardware, and may as well be executed by way of software. For executing the series of processes by way of software, a program constituting the software is installed from a program recording medium into a computer built in exclusive-use hardware, or for example, a general-purpose personal computer that can execute various functions with various programs being installed.

Incidentally, the program to be executed by the computer may be a program with which processes are carried out in chronological order along the sequence explained in this specification document, or may be a program with which processes are carried out in parallel or at the time as required, such as, in response to a call.

Furthermore, a scope of application of the embodiment of the present invention is not limited to only the embodiment described above, and various other variations may be made without departing from the concept of the present invention.

REFERENCE SIGNS LIST

11. RF unit
12. timing extraction unit
13. CP removing unit
14. FFT unit
15. channel estimation unit
16. demodulation unit
17. transmission processing unit
18. transmission timing adjustment unit
21. pilot symbol extraction unit 22. channel estimation processing unit (channel estimation means)
23. & 23a. frequency domain interpolation unit (interpolation means)
24. IFFT processing unit (transforming means)
25. & 25a. interpolation signal unit power calculation unit (interpolation signal unit power calculation means)
26. & 26a. power peak position detecting unit (power peak position detecting means)
31. interpolation signal creating unit
32. N-point IFFT left-end calculating unit
33. power value calculation unit
34. power value calculation unit
35. subtraction process unit
36. peak position detecting unit

The invention claimed is:

1. A receiver device receiving a signal transmitted by means of an orthogonal frequency division multiplexing system, comprising:
    a channel estimation means which calculates channel estimation values in a frequency domain based on pilot symbols arranged in orthogonal frequency division multiplexing subcarriers;
    an interpolation means which carries out an interpolation on the channel estimation values calculated by way of the channel estimation means to make the number of samples become a power of 2;
    a transforming means which transforms the channel estimation values, interpolated by the interpolation means, into a time domain to obtain a delay profile; and
    a power peak position detecting means which detects a power peak position in the delay profile to calculate a propagation delay time of the signal transmitted;
    wherein the power peak position detecting means refers to a signal power of a part interpolated by the interpolation means to detect an appropriate power peak position in the delay profile.

2. The receiver device according to claim 1, further comprising; an interpolation signal unit power calculation means which calculates a power value of a signal of a front part on a time-wise axis in the case where the same transformation as the transformation of the transforming means is carried out with respect to the signal power of the part interpolated; wherein the power peak position detecting means detects a power peak position in accordance with a delay profile after correction, which is obtained by way of subtracting a calculation result of the interpolation signal unit power calculation means, from a signal power of a corresponding part of the delay profile.

3. A transmit/receive terminal for transmitting and receiving data to/from a base station, comprising:
    a receiver device described in claim 1, as a receiving unit; and
    a means for adjusting a transmission timing to the base station, in accordance with the propagation delay time.

4. A transmit/receive terminal for transmitting and receiving data to/from a base station, comprising:
    a receiver device described in claim 2, as a receiving unit; and
    a means for adjusting a transmission timing to the base station, in accordance with the propagation delay time.

5. A propagation delay time measurement method, with receiving a signal transmitted by means of an orthogonal frequency division multiplexing system and measuring a propagation delay time of the signal, including;
    a channel estimation step calculating channel estimation values in a frequency domain based on pilot symbols arranged in orthogonal frequency division multiplexing subcarriers;
    an interpolation step carrying out an interpolation on the channel estimation values calculated in the channel estimation step to make the number of samples become a power of 2;
    a transforming step transforming the channel estimation values, interpolated in the interpolation step, into a time domain to obtain a delay profile; and
    a power peak position detecting step detecting a power peak position in the delay profile to calculate a propagation delay time of the signal transmitted;
    wherein the power peak position detecting step refers a signal power of a part interpolated in the interpolation step to detect an appropriate power peak position in the delay profile.

6. A non-transitory computer-readable storage medium storing a program computer program of the present invention, when the computer program is installed in a computer of a receiver device to receive a signal transmitted by means of an orthogonal frequency division multiplexing system, making the computer execute:
    a channel estimation step calculating channel estimation values in a frequency domain based on pilot symbols arranged in orthogonal frequency division multiplexing subcarriers;
    an interpolation step carrying out an interpolation on the channel estimation values calculated in the channel estimation step to make the number of samples become a power of 2;
    a transforming step transforming the channel estimation values, interpolated in the interpolation step, into a time domain to obtain a delay profile; and
    a power peak position detecting step detecting a power peak position in the delay profile by way of referring to a signal power of a part interpolated by the interpolation step to calculate a propagation delay time of the signal transmitted.

* * * * *